United States Patent [19]

Patterson et al.

[11] Patent Number: 5,749,056
[45] Date of Patent: May 5, 1998

[54] AUDIO RAMPING TECHNIQUE FOR A RADIO

[75] Inventors: Audley F. Patterson, Miramar; Hector E. Suarez, Miami; Craig P. Wadin, Sunrise, all of Fla.

[73] Assignee: Motorola, Inc., Schaumburg, Ill.

[21] Appl. No.: 522,200

[22] Filed: Aug. 31, 1995

[51] Int. Cl.$^6$ .................................................. H04B 1/16
[52] U.S. Cl. ........................ 455/569; 455/575; 455/200.1; 381/107
[58] Field of Search ................... 455/89, 54.1, 56.1, 455/177.1, 200.1, 355, 568, 569, 575; 379/58, 390; 381/104, 107

[56] References Cited

U.S. PATENT DOCUMENTS

| | | | |
|---|---|---|---|
| 3,659,050 | 4/1972 | Carlsson et al. | 179/1 HF |
| 4,178,488 | 12/1979 | Nishihata | 179/100 L |
| 4,237,448 | 12/1980 | Weinburg | 340/211 |
| 4,647,722 | 3/1987 | Nishida et al. | 379/63 |
| 5,276,956 | 1/1994 | Pawlish et al. | 455/575 |
| 5,404,582 | 4/1995 | Demuro et al. | 455/575 |
| 5,448,620 | 9/1995 | Gershkovich et al. | 381/107 |
| 5,450,618 | 9/1995 | Naddell et al. | 455/200.1 |
| 5,590,417 | 12/1996 | Rydbeck | 455/568 |
| 5,659,621 | 8/1997 | Newton | 381/68 |

*Primary Examiner*—Edward F. Urban
*Attorney, Agent, or Firm*—Barbara R. Doutre

[57] ABSTRACT

An audio ramping technique (200) reduces acoustic shock in radio (100) that has multiple operating modes each having a different nominal audio speaker level. The ramping technique (200) sets the audio speaker level to the same initial sound pressure level (SPL) (208) regardless of the mode of radio operation and then ramps the audio level (216) until either a user initiated control signal (212) is received or the audio level reaches a maximum threshold level (210).

15 Claims, 2 Drawing Sheets

AUDIO RAMPING TECHNIQUE FOR A RADIO

TECHNICAL FIELD

This invention relates in general to communication devices and more specifically to the control of audio ramping in radios.

BACKGROUND

Today's radios provide more operating features than ever before. An example of a new operating feature is the combination of two-way radio (half duplex) and telephone (full duplex) into a single communication device, such as a mobile radio, subscriber unit, or handset. By providing these two operating features in a single communication device, the user can select the operating mode of his/her choice. For example, a fire fighter can make contact with other individuals within a trunked operating system using a dispatch mode of operation and then switch to a phone interconnect mode of operation to make phone calls, such as to a hospital or outside office, without having to switch communication devices. Thus, the need of searching for a telephone at the sight of an accident or the need to carry a cellular telephone as well as a two way radio is eliminated.

Radios having different operating modes, such as the dispatch mode and the phone interconnect mode, are likely to have different nominal speaker audio levels for each mode. When a subscriber unit is used in the dispatch mode, the speaker volume level is generally defaulted to a sound pressure level which translates to a much higher level when the subscriber unit is coupled closely to the user's ear. Inexperienced users may inadvertently use a radio without verifying its mode of operation and be subjected to a high dispatch level of audio at the ear. Accordingly, there is a need for a technique that controls speaker volume level in a radio having operating modes with different nominal speaker audio levels.

DETAILED DESCRIPTION OF THE PREFERRED EMBODIMENT

Figure 1:
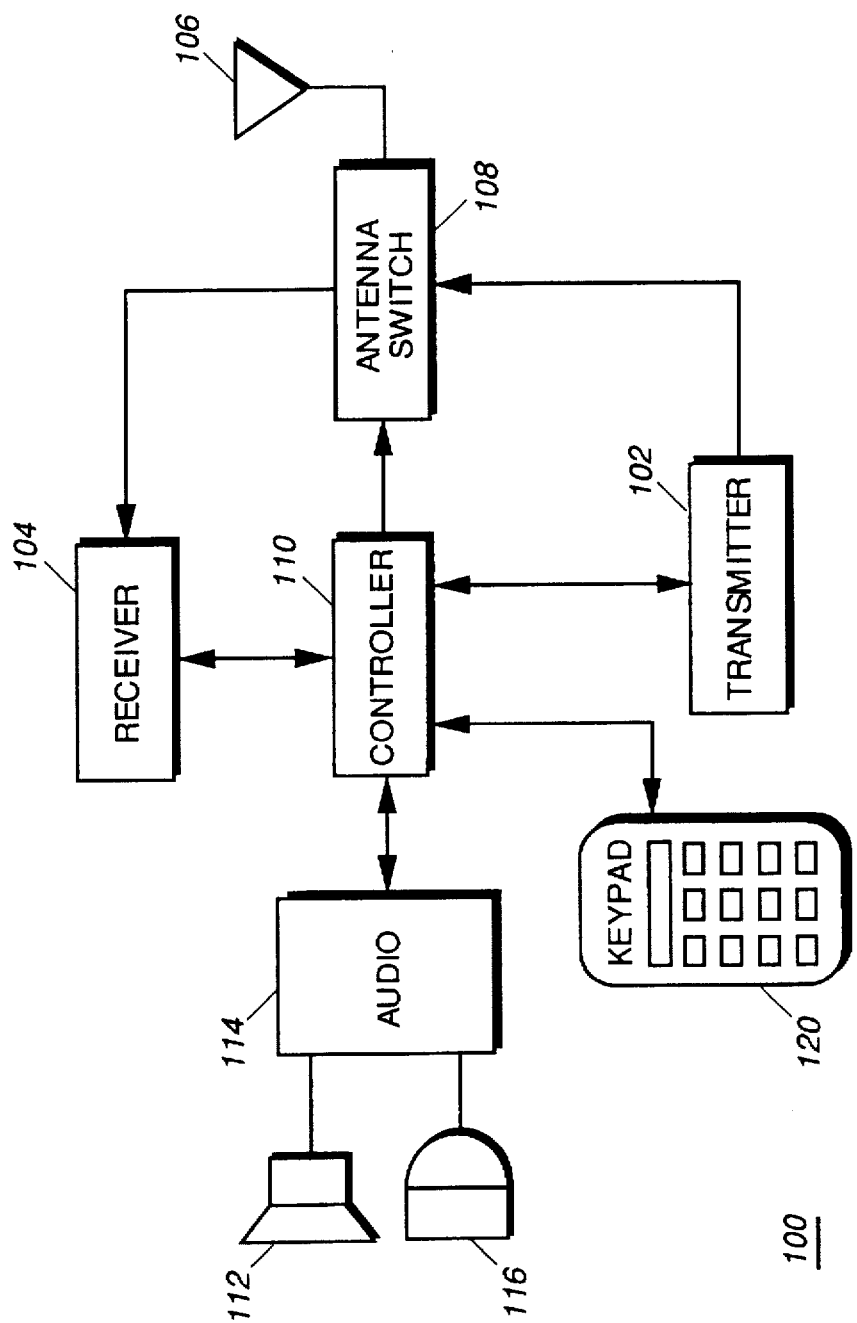
FIG. 1 shows a block diagram of a radio in accordance with the present invention.

Referring to FIG. 1 of the accompanying drawings, there is shown a radio 100 having first and second operating modes in accordance with the present invention. Radio 100 includes a transmitter 102, and receiver 104 which are selectively coupled to an antenna 106, via antenna switch 108. Receiver 104, transmitter 102 and antenna switch 108 are under the control of controller 110 which stores and executes control software. A speaker 112 is coupled to an audio section 114 in order to provide received electrical signals as audio to the user. Microphone 116 is coupled to audio section 114 in order to convert the user's voice into electrical signals usable to the controller 110 and transmitter 102. Audio section 114 controls such functions as the microphone gain of microphone 116 and the audio attenuation and amplification for the speaker 112. Keypad 120 is coupled to the controller 110 and allows the user to enable and disable operating features of the radio 100.

In accordance with the present invention, the first operating mode, enabled by controller 110 preferably through keypad 120, places the radio 100 in a dispatch mode of operation where the radio functions as a two-way half-duplex radio in a trunked system. The second mode of operation, similarly enabled, places the radio in a phone interconnect mode that allows the user to employ the radio as a cellular telephone. In accordance with the present invention, once radio operation is initiated in either the dispatch mode or the phone interconnect mode, the receive audio at speaker 112 is set to a predetermined level. Regardless of the mode of operation, the receive audio is set to the same predetermined level and then ramped up at a predetermined rate until a user initiated control signal indicates that the ramping should cease. The user initiated control signal is preferably generated through the keypad 120, indicating to the controller 110 that the sound pressure level has reached a comfortable level for the user and that the ramping should cease. Once the audio ramping ceases, the audio section 114 and controller 110 maintain the current audio level at speaker 112. The controller 110 also monitors the level of the audio at speaker 112 as it is being increased and compares this level to a predetermined maximum threshold, preferably stored in controller 110. If the audio level reaches the predetermined maximum threshold during the ramping process, the controller 110 terminates the ramping process and maintains the current maximum audio level.

The radio 100 as described by the invention uses the controller 110 and audio section 114 to initially set the speaker audio level to the same predetermined level regardless of the mode of operation of the radio and automatically increases the audio level at the same predetermined rate. The user can simply press a key of the keypad 120, for example the mute key, in order to maintain the speaker audio level or let the volume increase to its maximum threshold. The predetermined audio setting is preferably initiated at a low level, such as 50 dB-SPL next to the ear, and then ramped up at a predetermined rate from this level. In this way, a user picking up a radio enabled in the dispatch mode and inadvertently placing it next to his/her ear will only be subjected to an initial level of 50 dB-SPL. Hence, regardless of the mode of operation with which the radio is initiated, the possibility of the user being subjected to high levels of audio is greatly reduced.

Figure 2:
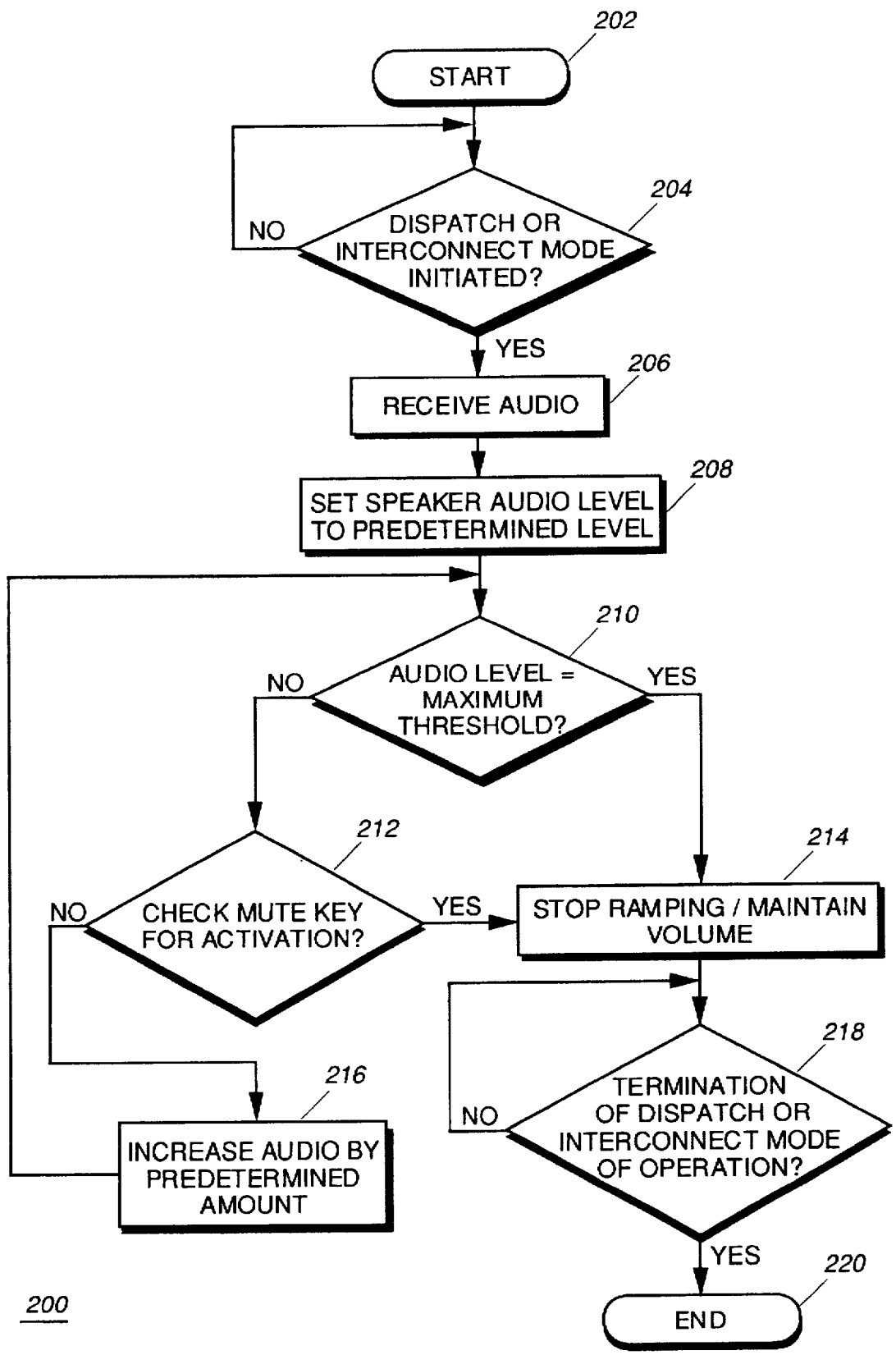
FIG. 2 shows a flowchart of the audio ramping technique in accordance with the present invention.

Referring now to FIG. 2 of the accompanying drawings, there is shown a flowchart of an audio ramping technique 200 in accordance with the present invention. In this preferred embodiment of the invention, the mute key of radio 100 is being used as the user initiated control signal to the controller 110, however, one skilled in the art can realize that a different function key can be used as well. The ramping technique starts at step 202 and checks for an initiation of either a dispatch mode of operation or a phone interconnect mode of operation at step 204. When either of these operating modes is initiated at step 204 and audio is received at step 206, the speaker audio level is automatically set to a predetermined level at step 208. Step 208 sets the speaker audio level to the same predetermined level regardless of the mode of operation. The speaker audio level is then compared to a predetermined maximum threshold at step 210. If the maximum threshold has not been exceeded at step 210, the controller monitors the mute key for activation at step 212. An activation of the mute key at step 212 indicates that the speaker audio level has reached a desired level that is comfortable for the user. If the mute key is not activated at step 212, the audio level is automatically ramped by increasing the audio level by a predetermined amount at step 216. The increased audio level is then compared to the maximum threshold at step 210. If the speaker audio level at step 210 reaches the maximum threshold indicating that a maximum speaker volume has been achieved, the audio ramping ceases, and the volume level is maintained at step 214. When a user activates the mute key indicating that a desired level of audio has been achieved at step 212, the audio ramping ceases and the volume level is maintained at step 214. Once the ramping ceases, the volume level is maintained at step 214 until the termination of the currently enabled operating mode is determined at step 218 which ends the audio ramping technique at step 220.

Hence, the audio ramping technique 200, as described by the invention, sets the speaker volume of a radio to a predetermined level, regardless of the mode of operation, and then automatically starts increasing the volume level until a user initiated control signal indicates that the desired volume is achieved or the audio level exceeds a predetermined maximum threshold. An example of the audio ramping technique of the present invention is to program the audio level at the speaker to measure approximately 50 dB-SPL at approximately one foot away from a user's head regardless of any previous volume settings or the mode of operation. The speaker volume can then be increased at a predetermined rate, such as 6 dB-SPL per second, during the ramping process. While the ramping takes place, the mute key (or other predetermined function key) is monitored by controller 110 for activation. If activation of the mute key is detected, the audio ramping process stops, and the speaker remains at the current SPL level. If the mute key is not activated, the ramping process will stop once a preset maximum volume has been reached.

While the preferred embodiment of the invention describes the maximum volume level as being set to the same threshold regardless of the mode of operation at step 210, an alternate embodiment could set different maximum threshold levels if desired. This alternate embodiment of the ramping technique could set separate maximum thresholds at step 210 based on which operating mode was initiated at step 204. This would allow the volume to be automatically ramped from the same level but up to different maximum levels. Hence, a radio in a dispatch mode of operation could be ramped up to a higher maximum volume than the same radio in a telephone interconnect mode. Both embodiments of the ramping technique described by the invention still encompass the concept of automatically ramping the audio from a predetermined level, regardless of the radio operating mode, until the user indicates that the volume has reached a desired level or the audio level has reached a maximum predetermined threshold.

Accordingly, there has been described a radio and audio ramping technique that reduces the potential for a user to be subjected to high levels of audio in a radio having operating modes with different optimum speaker audio levels. While the audio ramping technique has been described in terms of a radio having two operating modes with each mode having a different nominal volume setting, one skilled in the art realizes that the audio ramping technique as described by the invention extends to radio applications having more than two operating modes where each mode has a different nominal volume setting.

Numerous modifications, changes, variations, substitutions and equivalents will occur to those skilled in the art without departing from the spirit and scope of the present invention as defined by the appended claims.

What is claimed is:

1. A radio providing first and second operating modes each having different nominal audio speaker levels, including:

a controller for enabling either the first or second operating modes, said controller increasing the audio speaker level of each of the first and second operating modes from a similar predetermined level at a similar predetermined rate;

a speaker operatively coupled to the controller for generating the audio speaker level; and a keypad coupled to the controller for providing a user initiated control signal to the controller, said controller ceasing to increase the audio speaker level in response to the user initiated control signal, and the controller maintaining the audio speaker level in response to the user initiated control.

2. A radio as described in claim 1, wherein the controller compares the audio speaker level to a predetermined maximum threshold and automatically ceases increasing the audio speaker level in response to the audio speaker level reaching the predetermined maximum threshold.

3. A radio as described in claim 2, wherein the first operating mode is a dispatch mode and the second operating mode is a phone interconnect mode.

4. A radio as described in claim 1, wherein the controller maintains the audio speaker level until the controller switches the first or second operating modes at which time the audio speaker level is automatically set back to the similar predetermined level.

5. A method of controlling speaker volume in a radio having a plurality of operating modes where each operating mode has its own respective nominal audio speaker level, comprising the steps of:

initiating one of the plurality of operating modes at the radio;

receiving audio at the radio at a predetermined level, regardless of the operating mode;

determining if a user initiated control signal has been generated;

ramping the audio at a predetermined rate if no user initiated control signal was generated;

determining throughout the step of ramping if a user initiated control signal has been generated;

ceasing the step of ramping if the user initiated control signal has been generated; and maintaining the audio at a level set during the step of ceasing.

6. A method of controlling speaker volume in a radio as described in claim 5, wherein the step of ramping further includes the steps of:

determining the audio level of the received audio;

comparing the audio level to a predetermined maximum threshold; and terminating the step of ramping when the audio level reaches the predetermined maximum threshold.

7. A method of controlling speaker volume in a radio as described in claim 5, wherein the plurality of operating modes includes a phone interconnect mode and a dispatch mode.

8. A method of controlling speaker volume as described in claim 5, further comprising the step of automatically setting the audio back to the predetermined level when another of the plurality of operating modes is initiated.

9. A method of controlling speaker volume level in a radio having a dispatch mode of operation and a phone interconnect mode of operation, comprising the steps of:

initiating either the dispatch mode of operation or the interconnect mode of operation;

receiving audio at a predetermined audio level;

comparing the audio level to a predetermined maximum threshold;

increasing the audio level at a predetermined rate when the audio level does not exceed the predetermined maximum threshold;

determining if the audio level has reached a desired volume;

enabling a user initiated control once the desired volume is determined;

terminating the step of increasing the audio level once the predetermined maximum threshold has been reached or the audio level has reached the desired volume; and maintaining the audio level once the predetermined maximum threshold has been reached or the audio level has reached the desired volume.

10. A method of controlling speaker volume as described in claim 9, wherein the step of terminating includes the steps of:

automatically ceasing the step of increasing the audio level when the maximum predetermined threshold has been reached; and enabling a user initiated control signal to terminate the step of increasing the audio level when the audio level has reached a desired volume.

11. A method of controlling speaker volume as described in claim 9, further comprising the step of automatically setting the audio level back to the predetermined audio level when the radio switches from a dispatch mode of operation to a phone interconnect mode of operation or when the radio switches from a phone interconnect mode of operation to a dispatch mode of operation.

12. A method of controlling speaker volume level in a radio having a dispatch mode of operation and a phone interconnect mode of operation, comprising the steps of:

initiating either the dispatch mode of operation or the interconnect mode of operation;

receiving audio at a predetermined audio level;

determining the mode of operation of the radio;

comparing the audio level to a first predetermined maximum threshold if the dispatch mode of operation is determined;

comparing the audio level to a second predetermined maximum threshold if the phone interconnect mode of operation is determined;

increasing the audio level at a predetermined rate when the audio level does not exceed the first predetermined maximum threshold in the dispatch mode of operation;

increasing the audio level at the predetermined rate when the audio level does not exceed the second predetermined maximum threshold in the phone interconnect mode of operation;

determining if the audio level has reached a desired volume;

terminating the step of increasing the audio level by a user initiated control once the audio level has reached the desired volume or the first predetermined maximum threshold has been reached in the dispatch mode of operation or the second predetermined maximum threshold has been reached in the phone interconnect mode of operation; and maintaining the audio level achieved at the step of terminating.

13. A method of controlling speaker volume as described in claim 12, further comprising the step of automatically setting the audio to the predetermined audio level when the dispatch mode of operation is switched to the phone interconnect mode of operation or the phone interconnect mode of operation is switched to the dispatch mode of operation.

14. A method of controlling speaker volume level in a radio having a dispatch mode of operation and a phone interconnect mode of operation, comprising the steps of:

initiating either the dispatch mode of operation or the interconnect mode of operation;

receiving audio at a predetermined audio level;

comparing the audio level to a predetermined maximum threshold;

increasing the audio level at a predetermined rate when the audio level does not exceed the predetermined maximum threshold;

initiating a user control signal once a desired volume level is achieved; and maintaining the audio level once the predetermined maximum threshold has been reached or the audio level has reached the desired volume level.

15. A method of controlling speaker volume as described in claim 14, further comprising the step of automatically setting the audio level to the predetermined audio level when the dispatch mode of operation is switched to the phone interconnect mode of operation or the phone interconnect mode of operation is switched to the dispatch mode of operation.

* * * * *